United States Patent
Saito

(10) Patent No.: US 11,427,496 B2
(45) Date of Patent: Aug. 30, 2022

(54) GLASS SUBSTRATE

(71) Applicant: Nippon Electric Glass Co., Ltd., Shiga (JP)

(72) Inventor: Atsuki Saito, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 229 days.

(21) Appl. No.: 16/607,393

(22) PCT Filed: Apr. 12, 2018

(86) PCT No.: PCT/JP2018/015429
§ 371 (c)(1),
(2) Date: Oct. 23, 2019

(87) PCT Pub. No.: WO2018/198804
PCT Pub. Date: Nov. 1, 2018

(65) Prior Publication Data
US 2020/0131075 A1    Apr. 30, 2020

(30) Foreign Application Priority Data

Apr. 27, 2017 (JP) .............................. JP2017-087804
Jun. 2, 2017 (JP) .............................. JP2017-109939

(51) Int. Cl.
*C03C 3/087* (2006.01)
*C03B 17/06* (2006.01)
*H01L 51/50* (2006.01)

(52) U.S. Cl.
CPC .............. *C03C 3/087* (2013.01); *C03B 17/06* (2013.01); *H01L 51/50* (2013.01)

(58) Field of Classification Search
CPC .......... C03C 3/087; C03B 17/06; H01L 51/50
See application file for complete search history.

(56) References Cited

U.S. PATENT DOCUMENTS

2013/0237401 A1* 9/2013 Kawaguchi ............. C03C 3/091
501/66
2018/0141849 A1  5/2018 Saito et al.
2019/0016626 A1  1/2019 Saito et al.

FOREIGN PATENT DOCUMENTS

| JP | 2016-113361 | 6/2016 |
| TW | 201704173 | 2/2017 |
| WO | 2015/056645 | 4/2015 |
| WO | 2017/122576 | 7/2017 |

OTHER PUBLICATIONS

International Search Report dated Jun. 5, 2018 in International (PCT) Application No. PCT/JP2018/015429.
International Preliatinaty Report on Patentability dated Oct. 29, 2019 in International (PCT) Application No. PCT/JP2018/015429.

* cited by examiner

*Primary Examiner* — Karl E Group
*Assistant Examiner* — Cameron K Miller
(74) *Attorney, Agent, or Firm* — Wenderoth, Lind & Ponack, L.L.P.

(57) ABSTRACT

A glass substrate of the present invention has a temperature at a viscosity at high temperature of $10^{2.5}$ dPa·s of 1,650° C. or less, and an estimated viscosity Log $\eta_{500}$ at 500° C. of 26.0 or more calculated by the equation Log $\eta_{500}$=0.167× Ps−0.015×Ta−0.062×Ts−18.5.

13 Claims, 1 Drawing Sheet

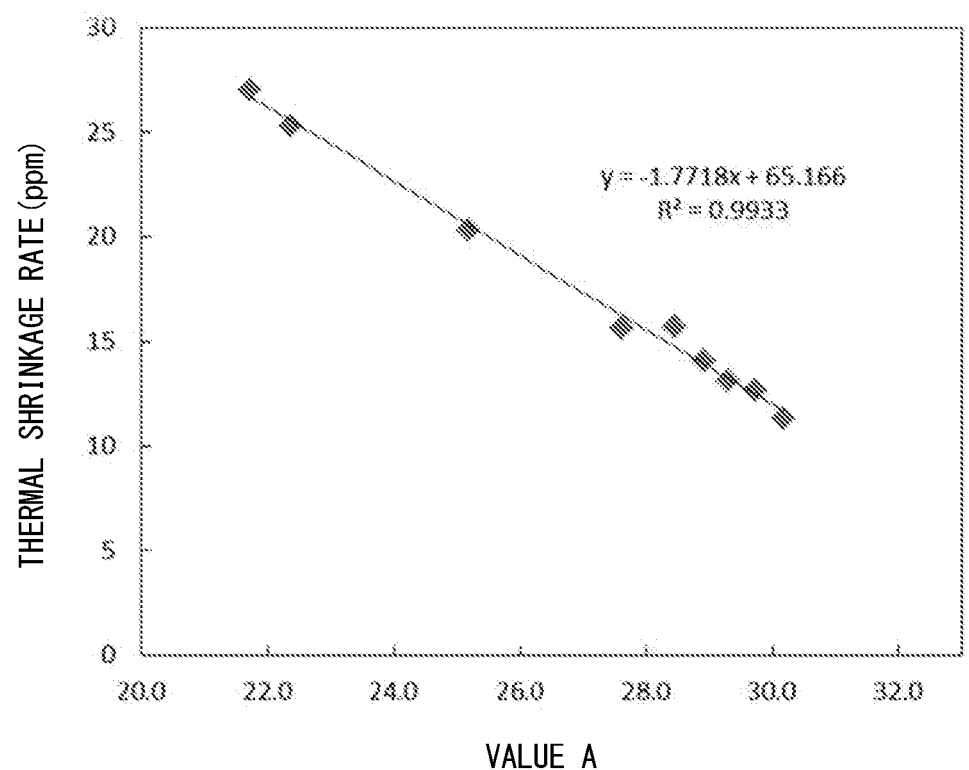

GLASS SUBSTRATE

TECHNICAL FIELD

The present invention relates to a glass substrate, and more particularly, to a glass substrate suitable as a substrate of a flat panel display, such as a liquid crystal display or an OLED display.

BACKGROUND ART

An OLED device, such as an OLED display, is used in applications such as displays of cellular phones because the OLED device is thin, is excellent in displaying a moving image, and has low power consumption.

A glass substrate is widely used as a substrate of the OLED display. Glass substantially free of an alkali metal oxide, or glass having a low content of an alkali metal oxide is used for the glass substrate of this application. That is, low-alkali glass is used for the glass substrate of this application. When the low-alkali glass is used, a situation in which an alkali ion is diffused in a heat treatment step into a semiconductor substance having been formed into a film can be prevented.

In recent years, a smart phone or a mobile terminal has required a display with high definition, and a low-temperature poly-silicon (LTPS) TFT or an oxide TFT has often been used as a semiconductor of a driving thin-film transistor (TFT).

SUMMARY OF INVENTION

Technical Problem

The glass substrate of this application is required to have, for example, the following characteristics (1) and (2).

(1) The glass substrate is required to have high productivity for a thin glass substrate, particularly have high meltability and a high fining property.

(2) In the production of a LIPS TFT or an oxide TFT, a heat treatment temperature is higher than in the case of a conventional amorphous Si TFT. Therefore, the glass substrate is required to have higher heat resistance than related-art substrates so as to be reduced in thermal shrinkage.

However, it is not easy to balance the demand characteristics (1) and (2). Specifically, when the heat resistance of the glass substrate is to be increased, the productivity (meltability or fining property) is liable to be reduced. In contrast, when the productivity of the glass substrate is to be increased, the heat resistance is liable to be reduced.

The present invention has been made in view of the above-mentioned circumstances, and a technical object of the present invention is to devise a glass substrate that can balance the productivity and the heat resistance.

Solution to Problem

The inventor of the present invention has found that the above-mentioned technical object can be achieved by restricting the viscosity characteristic of a glass substrate within a predetermined range. Thus, the finding is proposed as the present invention. According to one embodiment of the present invention, there is provided a glass substrate, which has a temperature at a viscosity at high temperature of $10^{2.5}$ dpa·s of 1,670° C. or less, and an estimated viscosity Log $\eta_{500}$ at 500° C. of 26.0 or more calculated by the following equation 1. Herein, the "temperature at $10^{2.5}$ dpa·s" may be measured by a platinum sphere pull up method. The "strain point", the "annealing point", and the "softening point" are values measured in accordance with methods specified in ASTM C336 and ASTM C338.

Log $\eta_{500}$=0.167×$Ps$−0.015×$Ta$−0.062×$Ts$−18.5

Ps: strain point (° C.)
Ta: annealing point (° C.)
Ts: softening point (° C.)

The heat resistance of the glass substrate has hitherto been evaluated by the temperatures of a strain point, an annealing point, and the like, which can be actually measured. However, the ranges of those temperatures are higher than a process temperature at the time of production of a LTPS TFT or an oxide TFT by about 200° C. or more. Therefore, the heat resistance of the glass substrate cannot be accurately evaluated by the temperatures of the strain point, the annealing point, and the like.

The inventor of the present invention has repeatedly performed various experiments. As a result, the inventor has found that the heat resistance of the glass substrate can be accurately evaluated by calculating the estimated viscosity at 500° C., which is close to the process temperature at the time of production of a LTPS TFT or an oxide TFT, and using the estimated viscosity as an indicator of the heat resistance.

The inventor of the present invention has further found that, even when glass substrates have the same strain point, which has hitherto been used as an indicator, such glass substrates are significantly different in heat resistance. Data showing a relationship between the estimated viscosity Log $\eta_{500}$ at 500° C. and a thermal shrinkage rate is shown in Table 1. The glass substrate P and the glass substrate Q have the same glass composition and the same strain point Ps. As apparent from Table 1, while the glass substrate P has an estimated viscosity Log $\eta_{500}$ at 500° C. of 27.8 and a thermal shrinkage rate of 17.5 ppm, the glass substrate Q has an estimated viscosity Log $\eta_{500}$ at 500° C. of 29.1 and a thermal shrinkage rate of 12.8 ppm. That is, although the glass substrate P and the glass substrate Q have the same glass composition and the same strain point Ps, their thermal shrinkage rates differ from each other by 4.7 ppm. In consideration of the fact that the thermal shrinkage rate of the glass substrate to be used for a display with high definition is particularly preferably 18 ppm or less, it can be said that the difference of 4.7 ppm is significant large. Moreover, the difference can be accurately estimated by using the estimated viscosity Log $\eta_{500}$ at 500° C. as an indicator. Herein, the "thermal shrinkage rate" is calculated as described below. First, a sample is marked with a linear mark at a predetermined position, and then bent perpendicular to the mark to be divided into two glass pieces. Next, one of the glass pieces is subjected to predetermined heat treatment (the glass piece is increased in temperature from normal temperature at a rate of 5° C./min, kept at a temperature of 500° C. for 1 hour, and decreased in temperature at a rate of 5° C./min). After that, the glass piece having been subjected to the heat treatment and another glass piece not having been subjected to the heat treatment are arranged next to each other, and are fixed with an adhesive tape T. Then, a shift between the marks is measured. The thermal shrinkage rate is calculated by the expression $\Delta L/L_0$ (unit: ppm) when the shift between the marks is represented by $\Delta L$ and the length of the sample before the heat treatment is represented by $L_0$.

TABLE 1

|  | P | Q |
|---|---|---|
| Ps [° C.] | 740 | 740 |
| Thermal shrinkage rate [ppm] | 17.5 | 12.8 |
| Log η at 500° C. [poise] | 27.8 | 29.1 |

In view of the foregoing, in the glass substrate according to the embodiment of the present invention, the estimated viscosity Log $\eta_{500}$ at 500° C. is restricted to 26.0 or more in consideration of the above-mentioned circumstances. With this, the heat resistance of the glass substrate can be increased.

Meanwhile, when a high-melting-point component is introduced in a large amount into a glass composition, the estimated viscosity Log $\eta_{500}$ at 500° C. can be increased. In this case, however, the productivity of the glass substrate is reduced owing to reductions in meltability and fining property. Therefore, in the glass substrate according to the embodiment of the present invention, the temperature at a viscosity at high temperature of $10^{2.5}$ dpa·s is restricted to 1,670° C. or less, and thus the above-mentioned situation is prevented.

In addition, it is preferred that the glass substrate according to the embodiment of the present invention have a value A of 25.0 or more calculated by the following equation 2.

Value $A$=Log $\eta_{500}$−[β-OH value (mm$^{-1}$)]×[content of $B_2O_3$ (mass %)]

Herein, the "β-OH value" is a value calculated by the following equation 3 with an FT-IR.

β-OH value=$(1/X)\log(T_1/T_2)$

X: Thickness (mm)
$T_1$: Transmittance (%) at a reference wavelength of 3,846 cm$^{-1}$
$T_2$: Minimum transmittance (%) at a wavelength around a hydroxyl group absorption wavelength of 3,600 cm$^{-1}$ In addition, it is preferred that the glass substrate according to the embodiment of the present invention have a β-OH value of 0.20/mm or less.

In addition, it is preferred that the glass substrate according to the embodiment of the present invention have a β-OH value of 0.15/mm or less.

In addition, it is preferred that the glass substrate according to the embodiment of the present invention have a content of $B_2O_3$ in a glass composition of less than 2.0 mass %.

In addition, it is preferred that the glass substrate according to the embodiment of the present invention comprise as a glass composition, in terms of mass %, 55% to 65% of $SiO_2$, 16% to 22% of $Al_2O_3$, 0% to 1% of $B_2O_3$, 0% to less than 0.1% of $Li_2O+Na_2O+K_2O$, 1% to 6% of MgO, 2% to 8% of CaO, 0% to 2% of SrO, 4% to 13% of BaO, 0% to less than 0.010% of $As_2O_3$, and 0% to less than 0.010% of $Sb_2O_3$.

In addition, it is preferred that the glass substrate according to the embodiment of the present invention have a content of $Fe_2O_3$ in a glass composition of 0.010 mass % or less.

In addition, it is preferred that the glass substrate according to the embodiment of the present invention have a liquidus temperature of 1,300° C. or less. Herein, the "liquidus temperature" refers to a temperature at which devitrification (devitrified crystal) is observed in glass when glass powder which has passed through a standard 30-mesh sieve (500 μm) and remained on a 50-mesh sieve (300 μm) is placed in a platinum boat and kept for 24 hours in a gradient heating furnace, followed by taking the platinum boat out of the gradient heating furnace.

In addition, it is preferred that the glass substrate according to the embodiment of the present invention comprise a formed joined surface in a center portion in a thickness direction, that is, be formed by an overflow down-draw method. Herein, the "overflow down-draw method" refers to a method in which molten glass is caused to overflow from both sides of a heat-resistant, trough-shaped structure, and the overflowing molten glasses are subjected to down-draw downward at the lower end of the trough-shaped structure while being joined, to thereby form a glass substrate.

In addition, it is preferred that the glass substrate according to the embodiment of the present invention be used as a substrate of an OLED device.

BRIEF DESCRIPTION OF DRAWINGS

FIG. 1 includes data showing a relationship between a value A and a thermal shrinkage rate.

DESCRIPTION OF EMBODIMENTS

A glass substrate of the present invention has a temperature at a viscosity at high temperature of $10^{2.5}$ poise of 1,670° C. or less, preferably 1,650° C. or less, 1,640° C. or less, or 1,630° C. or less, particularly preferably from 1,500° C. to 1,620° C. When the temperature at $10^{2.5}$ poise is high, the manufacturing cost of the glass substrate is increased owing to reductions in meltability and fining property.

The glass substrate of the present invention has an estimated viscosity Log $\eta_{500}$ at 500° C. of 26.0 or more, preferably 28.0 or more, 28.5 or more, or 29.0 or more, particularly preferably from 29.5 to 35. When the estimated viscosity Log $\eta_{500}$ at 500° C. is too low, the heat resistance of the glass substrate is reduced, and the thermal shrinkage rate of the glass substrate is increased.

According to investigations made by the inventor of the present invention, it has been found that the value A calculated by the equation Value A=Log $\eta_{500}$−[β-OH value]× [content of $B_2O_3$] has a high correlation with an actually measured value for the thermal shrinkage rate, and as the value A becomes higher, the thermal shrinkage rate becomes lower. FIG. 1 includes data showing a relationship between the value A and the thermal shrinkage rate. In the glass substrate of the present invention, the value A is preferably 25.0 or more, 27.0 or more, 28.0 or more, or 29.0 or more, particularly preferably from 30.0 to 40.0. When the value A is too low, the heat resistance of the glass substrate is reduced, and the thermal shrinkage rate of the glass substrate is liable to be increased.

As apparent from the equation 3, a small amount of water present in glass affects relaxation behavior of the glass. The relaxation includes rapid relaxation other than slow relaxation controlled by a viscosity, and as the thermal shrinkage rate becomes lower, the ratio of the rapid relaxation becomes higher. The rapid relaxation is liable to occur when the water content in the glass is increased. Therefore, as the water content in the glass becomes smaller, the rapid relaxation is less liable to occur, and in a glass range in which the thermal shrinkage rate is low as in the glass substrate of the present invention, a reducing effect on the thermal shrinkage rate becomes relatively higher. Therefore, the β-OH value is preferably 0.20/mm or less, 0.15/mm or less, 0.12/mm or less, 0.11/mm or less, 0.10/mm or less, 0.09/mm or less, or 0.07 or less, particularly preferably from 0.01/mm to 0.05/mm.

A method of reducing the β-OH value is exemplified by the following methods (1) to (7). Of those, the methods (1) to (4) are effective. (1) A method involving selecting raw materials having low water contents. (2) A method involving adding a desiccant, such as $SO_3$ or Cl, into a glass batch. (3) A method involving performing heating through application of a current with a heating electrode. (4) A method involving adopting a small melting furnace. (5) A method involving reducing the water content in a furnace atmosphere. (6) A method involving performing $N_2$ bubbling in molten glass. (7) A method involving increasing the flow rate of molten glass.

As apparent from the equation 3, as the content of $B_2O_3$ in the glass composition becomes smaller, the thermal shrinkage rate becomes lower. This is because, as the content of $B_2O_3$ becomes smaller, the glass more easily maintains a state of having a low water content. Specifically, when $B_2O_3$, particularly three-coordinate boron is included in a large amount in the glass, the solubility of water is increased, and it becomes difficult for the glass to maintain a state of having a low water content. Therefore, in the glass substrate of the present invention, the content of $B_2O_3$ in the glass composition is preferably 2 mass % or less, 1.5 mass % or less, 1 mass % or less, or less than 1.0 mass %, particularly preferably from 0.1 mass % to 0.9 mass %.

The glass substrate of the present invention preferably comprises as a glass composition, in terms of mass %, 55% to 65% of $SiO_2$, 16% to 22% of $Al_2O_3$, 0% to 1% of $B_2O_3$, 0% to less than 0.1% of $Li_2O+Na_2O+K_2O$, 1% to 6% of MgO, 2% to 8% of CaO, 0% to 2% of SrO, 4% to 13% of BaO, 0% to less than 0.010% of $As_2O_3$, and 0% to less than 0.010% of $Sb_2O_3$. The reasons why the contents of the components are limited as described above are described below. The expression "%" represents "mass %" in the descriptions of the contents of the components.

The lower limit of the content range of $SiO_2$ is preferably 55% or more, 56% or more, 57% or more, or 58% or more, particularly preferably 59% or more, and the upper limit of the content range of $SiO_2$ is preferably 65% or less, 64% or less, or 63% or less, particularly preferably 62% or less. When the content of $SiO_2$ is too small, a devitrified crystal containing $Al_2O_3$ is liable to be generated, and in addition, a strain point is liable to lower. Meanwhile, when the content of $SiO_2$ is too large, a viscosity at high temperature increases, and thus meltability is liable to lower. In addition, a devitrified crystal, such as cristobalite, precipitates, and a liquidus temperature is liable to increase.

The lower limit of the content range of $Al_2O_3$ is preferably 16% or more, 17% or more, or 18% or more, particularly preferably 18.5% or more, and the upper limit of the content range of $Al_2O_3$ is preferably 22% or less or 21% or less, particularly preferably 20% or less. When the content of $Al_2O_3$ is too small, the strain point is liable to lower, and in addition, glass is liable undergo phase separation. Meanwhile, when the content of $Al_2O_3$ is too large, the devitrified crystal, such as mullite or anorthite, precipitates, and the liquidus temperature is liable to increase.

The preferred content of $B_2O_3$ is as described above.

As described above, $Li_2O$, $Na_2O$, and $K_2O$ are each a component which deteriorates the characteristics of a semiconductor film. Therefore, the total content of $Li_2O$, $Na_2O$, and $K_2O$ and the content of each of $Li_2O$, $Na_2O$, and $K_2O$ are preferably less than 1.0%, less than 0.50%, less than 0.20%, less than 0.10%, or less than 0.08%, particularly preferably less than 0.06%. Meanwhile, when $Li_2O$, $Na_2O$, and $K_2O$ are introduced in a small amount, the glass is easily melted by heating through application of a current with a heating electrode because of a reduction in electrical resistivity of molten glass. Therefore, the total content of $Li_2O$, $Na_2O$, and $K_2O$ and the content of each of $Li_2O$, $Na_2O$, and $K_2O$ are preferably 0.01% or more, 0.02% or more, 0.03% or more, or 0.04% or more, particularly preferably 0.05% or more. In comprehensive consideration of effects on the semiconductor film and a reduction in electrical resistivity, it is preferred to preferentially introduce $Na_2O$ out of $Li_2O$, $Na_2O$, and $K_2O$.

MgO is a component which reduces the viscosity at high temperature and thus increases the meltability. The content of MgO is preferably from 1% to 6%, from 2% to 5.5%, or from 2.5% to 5.5%, particularly preferably from 3% to 5%. When the content of MgO is too small, it becomes difficult to exhibit the above-mentioned effects. Meanwhile, when the content of MgO is too large, the strain point is liable to lower.

CaO is a component which reduces the viscosity at high temperature and thus increases the meltability without reducing the strain point. In addition, a raw material for introducing CaO is relatively inexpensive among those for alkaline earth metal oxides, and hence CaO is a component which achieves a reduction in raw material cost. The content of CaO is preferably from 2% to 8%, from 3% to 8%, from 4% to 9%, or from 4.5% to 8%, particularly preferably from 5% to 7%. When the content of CaO is too small, it becomes difficult to exhibit the above-mentioned effects. Meanwhile, when the content of CaO is too large, a thermal expansion coefficient excessively increases, and in addition, the glass is liable to devitrify.

SrO is a component which increases devitrification resistance, and is also a component which reduces the viscosity at high temperature and thus increases the meltability without reducing the strain point. The content of SrO is preferably from 0% to 2%, from 0% to 1.5%, from 0.1% to 1.5%, or from 0.2% to 1%, particularly preferably from 0.3% to less than 1.0%. When the content of SrO is too small, it becomes difficult to exhibit an effect of suppressing phase separation or an effect of increasing the devitrification resistance. Meanwhile, when the content of SrO is too large, the balance of the components in the glass composition is impaired, and a strontium silicate-based devitrified crystal is liable to precipitate.

BaO is a component which remarkably increases the devitrification resistance among the alkaline earth metal oxides. The content of BaO is preferably from 4% to 13%, from 5% to 12%, or from 6% to 11%, particularly preferably from 7% to 10%. When the content of BaO is too small, the liquidus temperature increases, and thus the devitrification resistance is liable to lower. Meanwhile, when the content of BaO is too large, the balance of the components in the glass composition is impaired, and a devitrified crystal containing BaO is liable to precipitate.

The content of RO (the total content of MgO, CaO, SrO, and BaO) is preferably from 10% to 22%, from 13% to 21%, or from 14% to 20%, particularly preferably from 15% to 20%. When the content of RO is too small, the meltability is liable to lower. Meanwhile, when the content of RO is too large, the balance of the components in the glass composition is impaired, and the devitrification resistance is liable to lower.

$As_2O_3$ and $Sb_2O_3$ are each a component which causes the glass to be colored when the glass is melted by heating through application of a current with a heating electrode without heating with a combustion flame of a burner. The content of each of $As_2O_3$ and $Sb_2O_3$ is preferably less than 0.010%, particularly preferably less than 0.0050%.

Other than the above-mentioned components, for example, the following components may be added to the glass composition. From the viewpoint of exhibiting the effects of the present invention appropriately, the total content of the components other than the above-mentioned components is preferably 5% or less, particularly preferably 3% or less.

ZnO is a component which increases the meltability. However, when ZnO is contained in a large amount, the glass is liable to devitrify, and in addition, the strain point is liable to lower. The content of ZnO is preferably from 0% to 5%, from 0% to 3%, or from 0% to 0.5%, particularly preferably from 0% to 0.2%.

$P_2O_5$ is a component which increases the strain point. However, when $P_2O_5$ is contained in a large amount, the glass is liable to undergo phase separation. The content of $P_2O_5$ is preferably from 0% to 1.5% or from 0% to 1.2%, particularly preferably from 0% to 1%.

$TiO_2$ is a component which reduces the viscosity at high temperature and thus increases the meltability, and is also a component which suppresses solarisation. However, when $TiO_2$ is contained in a large amount, the glass is colored, and thus a transmittance is liable to lower. Therefore, the content of $TiO_2$ is preferably from 0% to 3%, from 0% to 1%, or from 0% to 0.1%, particularly preferably from 0% to 0.02%.

$Fe_2O_3$ is a component which is inevitably mixed as an impurity derived from glass raw materials. In addition, in some cases, $Fe_2O_3$ is positively added (for example, at 0.003% or more, particularly 0.005% or more) in expectation of playing a role as a fining agent or playing a role in reducing the electrical resistivity of the molten glass. Meanwhile, from the viewpoint of increasing a transmittance in an ultraviolet region, it is preferred to reduce the content of $Fe_2O_3$ to the extent possible. When the transmittance in the ultraviolet region is increased, irradiation efficiency can be increased at the time of using a laser in the ultraviolet region in a step of a display. Therefore, the content of $Fe_2O_3$ is preferably 0.020% or less, 0.015% or less, or 0.010% or less, particularly preferably less than 0.010%.

$Y_2O_3$, $Nb_2O_5$, and $La_2O_3$ each have an action of increasing the strain point, a Young's modulus, and the like. However, when the contents of those components are too large, a density and the raw material cost are liable to increase. Therefore, the content of each of $Y_2O_3$, $Nb_2O_5$, and $La_2O_3$ is preferably from 0% to 3%, from 0% to 1%, or from 0% to less than 0.10%, particularly preferably from 0% to less than 0.05%.

Cl is a component which acts as a desiccant and thus reduces a β-OH value. Therefore, when Cl is introduced, the lower limit of the content of Cl is preferably 0.001% or more or 0.003% or more, particularly preferably 0.005% or more. However, when the content of Cl is too large, the strain point is liable to lower. Therefore, the upper limit of the content of Cl is preferably 0.5% or less or 0.2% or less, particularly preferably 0.08% or less. An alkaline earth metal chloride, such as strontium chloride, aluminum chloride, or the like may be used as a raw material for introducing Cl.

$SO_3$ is a component which acts as a desiccant and thus reduces a β-OH value. Therefore, when $SO_3$ is introduced, the lower limit of the content of $SO_3$ is preferably 0.0001% or more, particularly preferably 0.0005% or more. However, when the content of $SO_3$ is too large, reboil bubbles are liable to be generated. Therefore, the upper limit of the content of $SO_3$ is preferably 0.05% or less, 0.01% or less, or 0.005% or less, particularly preferably 0.001% or less.

$SnO_2$ is a component which exhibits a satisfactory fining action in a high temperature region. In addition, $SnO_2$ is a component which increases the strain point, and is also a component which reduces the viscosity at high temperature. The content of $SnO_2$ is preferably from 0% to 1%, from 0.001% to 1%, or from 0.05% to 0.5%, particularly preferably from 0.1% to 0.3%. When the content of $SnO_2$ is too large, a devitrified crystal of $SnO_2$ is liable to precipitate. When the content of $SnO_2$ is less than 0.001%, it becomes difficult to exhibit the above-mentioned effects.

A fining agent other than $SnO_2$ may be used unless the characteristics of the glass are significantly impaired. Specifically, $CeO_2$, F, and C may be added at, for example, up to 1% in terms of their total content. Metal powders, such as Al powder and Si powder, may be added at, for example, up to 1% in terms of their total content.

The glass substrate of the present invention preferably has the following characteristics.

The strain point is preferably 700° C. or more, 720° C. or more, 730° C. or more, 740° C. or more, or 750° C. or more, particularly preferably from 760° C. to 840° C. With this, thermal shrinkage of the glass substrate is easily suppressed in a manufacturing process for a LTPS TFT or an oxide TFT.

The liquidus temperature is preferably 1,300° C. or less, 1,280° C. or less, 1,260° C. or less, or 1,250° C. or less, particularly preferably from 900° C. to 1,230° C. With this, a situation in which a devitrified crystal is generated during forming is easily prevented. Further, the forming of the glass substrate is easily performed by an overflow down-draw method, and hence the surface quality of the glass substrate can be increased. The liquidus temperature serves as an indicator of the devitrification resistance. A lower liquidus temperature indicates more excellent devitrification resistance.

A viscosity at the liquidus temperature is preferably $10^{4.8}$ poise or more, $10^{5.0}$ poise or more, or $10^{5.3}$ poise or more, particularly preferably from $10^{5.5}$ poise to $10^{7.0}$ poise. With this, a situation in which a devitrified crystal is generated during forming is easily prevented. Further, the forming of the glass substrate is easily performed by an overflow down-draw method, and hence the surface quality of the glass substrate can be increased. The "viscosity at a liquidus temperature" may be measured by a platinum sphere pull up method.

The thermal shrinkage rate is preferably 21 ppm or less, 18 ppm or less, 15 ppm or less, or 12 ppm or less, particularly preferably from 1 ppm to 10 ppm when the glass substrate is increased in temperature from normal temperature at a rate of 5° C./min, kept at a temperature of 500° C. for 1 hour, and decreased in temperature at a rate of 5° C./min. When the thermal shrinkage rate is high, the manufacturing yield of a panel with high definition is liable to lower.

The glass substrate of the present invention has a thickness of preferably from 0.05 mm to 0.7 mm or from 0.1 mm to 0.5 mm, particularly preferably from 0.2 mm to 0.4 mm. When the thickness becomes smaller, reductions in weight and thickness of a display are easily achieved. However, when the thickness is small, it is highly necessary to increase a forming speed (sheet-drawing speed). In this case, the thermal shrinkage rate of the glass substrate is liable to increase. In the present invention, the heat resistance is high, and hence such situation can be effectively suppressed even when the forming speed (sheet-drawing speed) is high.

It is preferred that the glass substrate of the present invention comprise a formed joined surface in a center portion in a thickness direction, that is, be formed by an overflow down-draw method. Through the forming by the overflow down-draw method, surfaces to serve as the surfaces of the glass substrate are formed in a state of free surfaces without being brought into contact with a trough-shaped refractory. As a result, a glass substrate having satisfactory surface quality can be manufactured at low cost without polishing. In addition, the overflow down-draw method also has the advantage of easy forming of a glass substrate having a small thickness.

In general, a manufacturing process for the glass substrate comprises a blending step, a melting step, a fining step, a supplying step, a stirring step, and a forming step. The blending step is a step of blending glass raw materials to produce a glass batch. The melting step is a step of melting the glass batch to provide molten glass. The fining step is a step of fining the molten glass obtained in the melting step by an action of a fining agent or the like. The supplying step is a step of transferring the molten glass from one step to another. The stirring step is a step of stirring the molten glass to homogenize the molten glass. The forming step is a step of forming the molten glass into a sheet shape. A step other than the above-mentioned steps, for example, a state adjusting step of adjusting the molten glass to be in a state suitable for forming may be introduced after the stirring step as required.

Low-alkali glass is generally melted by combustion heating with a burner. The burner is generally arranged at an upper portion of a melting kiln, and uses fossil fuel as its fuel, specifically, for example, liquid fuel, such as heavy oil, or gas fuel, such as LPG. A combustion flame may be obtained by combusting a mixed gas of the fossil fuel and oxygen gas.

However, the combustion heating with a burner is liable to entail an increase in β-OH value of the glass substrate because a large amount of water is mixed in the molten glass. In view of the foregoing, a method of industrially manufacturing the glass substrate of the present invention preferably comprises heating the glass batch through application of a current with a heating electrode. With this, by the heating through application of a current with a heating electrode arranged on a wall surface of the melting kiln, the temperature of the molten glass is reduced from a bottom surface of the melting kiln toward an upper surface of the melting kiln, and hence the glass batch is present under a solid state in a large amount on a liquid surface of the molten glass in the melting kiln. As a result, water having adhered to the glass batch under a solid state evaporates, and thus an increase in water content resulting from the raw material can be suppressed. Further, when the heating through application of a current with a heating electrode is performed, the amount of energy required for obtaining the molten glass per unit mass is reduced, and the amount of a melt volatile is reduced. As a result, an environmental load can be reduced.

In the method of industrially manufacturing the glass substrate of the present invention, it is further preferred to perform the heating through application of a current with a heating electrode without performing combustion heating with a burner. When the combustion heating with a burner is performed, water to be generated during combustion of fossil fuel is liable to be mixed in the molten glass. Therefore, when the combustion heating with a burner is not performed, the β-OH value of the molten glass is easily reduced. The "perform the heating through application of a current with a heating electrode without performing combustion heating with a burner" refers to a case of continuously melting the glass batch only by heating through application of a current with a heating electrode. However, it is allowed to use a burner in, for example, a case of performing combustion heating with a burner at the time of starting up of the melting kiln, and a case of locally and supplementarily performing combustion heating with a burner at a specific position of the melting kiln.

The heating through application of a current with a heating electrode is preferably performed by applying an alternating voltage to a heating electrode arranged at a bottom portion or a side portion of a melting kiln so as to be brought into contact with the molten glass in the melting kiln. A material used for the heating electrode preferably has heat resistance and corrosion resistance to the molten glass. For example, tin oxide, molybdenum, platinum, or rhodium may be used. Of those, molybdenum is particularly preferred because of having high heat resistance and a high degree of freedom of arrangement in the melting kiln.

The low-alkali glass, which has a low content of an alkali metal oxide, has a high electrical resistivity. Therefore, when the heating through application of a current with a heating electrode is applied to the low-alkali glass, there is a risk in that the current flows not only in the molten glass but also in a refractory constituting the melting kiln, with the result that the refractory is damaged early. In order to prevent such situation, it is preferred to use, as a refractory in a furnace, a zirconia-based refractory having a high electrical resistivity, particularly zirconia electrocast bricks. As described above, it is also preferred to introduce a component which reduces the electrical resistivity ($Li_2O$, $Na_2O$, $K_2O$, $Fe_2O_3$, or the like) in the molten glass in a small amount. The content of $ZrO_2$ in the zirconia-based refractory is preferably 85 mass % or more, particularly preferably 90 mass % or more.

EXAMPLES

The present invention is hereinafter described by way of Examples. However, Examples below are merely examples, and the present invention is by no means limited to Examples below.

Examples (Sample Nos. 1 to 6) and Comparative Examples (Sample Nos. 7 to 9) of the present invention are shown in Table 2.

TABLE 2

|  |  | No. 1 | No. 2 | No. 3 | No. 4 | No. 5 | No. 6 | No. 7 | No. 8 | No. 9 |
|---|---|---|---|---|---|---|---|---|---|---|
| Glass composition [wt %] | $SiO2$ | 58.8 | 61.2 | 61.2 | 61.1 | 61.1 | 61.0 | 63.9 | 58.8 | 58.6 |
|  | $Al_2O_3$ | 19.3 | 18.1 | 18.1 | 18.2 | 18.3 | 18.6 | 17.0 | 19.3 | 19.4 |
|  | $B_2O_3$ | 6.6 | 1.5 | 1.1 | 0.8 | 0.7 | 0.7 | 0.4 | 6.6 | 6.6 |
|  | MgO | 2.5 | 3.2 | 3.2 | 3.3 | 3.3 | 3.2 | 1.8 | 2.5 | 2.5 |
|  | CaO | 6.3 | 5.2 | 5.2 | 5.2 | 5.2 | 5.1 | 5.9 | 6.2 | 6.3 |
|  | SrO | 0.5 | 0.9 | 0.8 | 0.7 | 0.6 | 0.6 | 0.8 | 0.5 | 0.5 |
|  | BaO | 5.7 | 9.7 | 10.0 | 10.4 | 10.4 | 10.4 | 10.0 | 5.8 | 5.7 |

TABLE 2-continued

|  | No. 1 | No. 2 | No. 3 | No. 4 | No. 5 | No. 6 | No. 7 | No. 8 | No. 9 |
|---|---|---|---|---|---|---|---|---|---|
| ZnO | 0.0 | 0.0 | 0.0 | 0.0 | 0.0 | 0.0 | 0.0 | 0.0 | 0.0 |
| $SnO_2$ | 0.2 | 0.2 | 0.2 | 0.2 | 0.2 | 0.2 | 0.2 | 0.2 | 0.2 |
| Logη at 500 °C. [poise] | 26.1 | 28.6 | 29.1 | 29.4 | 29.8 | 30.2 | 27.8 | 24.3 | 24.7 |
| Value A: [η500] − [β-OH = $B_2O_3$] | 25.2 | 28.4 | 28.9 | 29.3 | 29.7 | 30.2 | 27.6 | 21.7 | 22.4 |
| Thermal shrinkage rate [ppm] | 20.3 | 15.7 | 14.1 | 13.1 | 12.7 | 11.3 | 15.6 | 27.0 | 25.3 |
| β-OH [/mm] | 0.134 | 0.122 | 0.125 | 0.121 | 0.097 | 0.049 | 0.397 | 0.389 | 0.349 |
| Ps [° C.] | 700 | 736 | 740 | 743 | 746 | 751 | 740 | 686 | 689 |
| Ta [° C.] | 755 | 795 | 798 | 801 | 804 | 809 | 801 | 743 | 746 |
| Ts [° C.] | 984 | 1,030 | 1,033 | 1,035 | 1,036 | 1,042 | 1,053 | 978 | 979 |
| $10^{4.0}$ poise [° C.] | 1,294 | 1,347 | 1,349 | 1,351 | 1,352 | 1,362 | 1,396 | 1,285 | 1,285 |
| $10^{3.0}$ poise [° C.] | 1,447 | 1,509 | 1,510 | 1,512 | 1,513 | 1,526 | 1,568 | 1,440 | 1,440 |
| $10^{2.5}$ poise [° C.] | 1,548 | 1,609 | 1,611 | 1,613 | 1,614 | 1,633 | 1,679 | 1,540 | 1,540 |
| TL [° C.] | 1,123 | Not measured | Not measured | Not measured | Not measured | 1,218 | 1,225 | Not measured | 1,123 |
| LogηTL [poise] | 5.6 | Not measured | Not measured | Not measured | Not measured | 5.3 | 5.5 | Not measured | 5.6 |

First, a glass batch blended so as to achieve a glass composition and a β-OH value shown in the table was loaded in a small test melting furnace formed of zirconia electrocast bricks, and then melted at from 1,600° C. to 1,650° C. by heating through application of a current with a molybdenum electrode without heating with a combustion flame of a burner. Thus, molten glass was obtained. In the case of each of Sample Nos. 1 to 6, a burner was used only at the time of start of the operation of the melting furnace, and the burner was stopped after the formation of the molten glass. In the case of each of Sample Nos. 7 to 9, the glass batch was melted by adopting heating with a combustion flame of an oxygen burner and heating through application of a current with a heating electrode in combination. Subsequently, the molten glass was fined through use of a Pt—Rh vessel, stirred, and then supplied to a zircon forming body and formed into a flat sheet shape having a thickness of 0.5 mm by an overflow down-draw method. The resultant glass substrate was evaluated for a β-OH value, a thermal shrinkage rate, an estimated viscosity Log $η_{500}$ at 500° C., a strain point Ps, an annealing point Ta, a softening point Ts, a temperature at a viscosity of $10^{4.0}$ poise, a temperature at a viscosity of $10^{3.0}$ poise, a temperature at a viscosity of $10^{2.5}$ poise, a liquidus temperature TL, a viscosity at a liquidus temperature log ηTL, and a value A.

The estimated viscosity Log $η_{500}$ at 500° C. is a value calculated by the above-mentioned equation 1.

The value A is a value calculated by the above-mentioned equation 2.

The thermal shrinkage rate is calculated as described below. First, a sample is marked with a linear mark at a predetermined position, and then bent perpendicular to the mark to be divided into two glass pieces. Next, one of the glass pieces is subjected to predetermined heat treatment (the glass piece is increased in temperature from normal temperature at a rate of 5° C./min, kept at a temperature of 500° C. for a time of 1 hour, and decreased in temperature at a rate of 5° C./min). After that, the glass piece having been subjected to the heat treatment and another glass piece not having been subjected to the heat treatment are arranged next to each other, and are fixed with an adhesive tape T. Then, a shift between the marks is measured. The thermal shrinkage rate is calculated by the expression $ΔL/L_0$ (unit: ppm) when the shift between the marks is represented by ΔL and the length of the sample before the heat treatment is represented by $L_0$.

The β-OH value is a value calculated by the above-mentioned equation 3 with an FT-IR.

The strain point Ps, the annealing point Ta, and the softening point Ts are values measured in accordance with methods specified in ASTM C336 and ASTM C338.

The temperatures at viscosities at high temperature of $10^{4.0}$ poise, $10^{3.0}$ poise, and $10^{2.5}$ poise are values measured by a platinum sphere pull up method.

The liquidus temperature TL is a value obtained by measuring a temperature at which a crystal precipitates when glass powder which has passed through a standard 30-mesh sieve (500 μm) and remained on a 50-mesh sieve (300 μm) is placed in a platinum boat and then kept for 24 hours in a gradient heating furnace. In addition, the viscosity at a liquidus temperature log ηTL is a value measured by a platinum sphere pull up method.

As apparent from Table 2, each of Sample Nos. 1 to 6 had a high estimated viscosity Log $η_{500}$ at 500° C. and a low temperature at a viscosity at high temperature of $10^{2.5}$ poise, and hence had a low thermal shrinkage rate and high productivity. Meanwhile, Sample No. 7 had a high temperature at a viscosity at high temperature of $10^{2.5}$ poise, and hence had low productivity. Each of Sample Nos. 8 and 9 had a low estimated viscosity Log $η_{500}$ at 500° C., and hence had a high thermal shrinkage rate.

INDUSTRIAL APPLICABILITY

Other than as a substrate for a flat panel display, such as a liquid crystal display or an OLED display, the glass substrate of the present invention is suitable, for example, as a cover glass for an image sensor, such as a charge coupled device (CCD) or a contact image sensor (CIS), a substrate or a cover glass for a solar cell, or a substrate for an OLED lighting device.

The invention claimed is:

1. A glass substrate, which has a temperature at a viscosity at high temperature of $10^{2.5}$ poise of 1,670° C. or less, and an estimated viscosity Log $η_{500}$ at 500° C. of 26.0 or more calculated by the following equation:

Log $η_{500}$=0.167×Ps−0.015×Ta−0.062×Ts−18.5, where

Ps: strain point (° C.),
Ta: annealing point (° C.), and
Ts: softening point (° C.), wherein the glass substrate comprises as a glass composition, in terms of mass %, 18.1% to 22% of $Al_2O_3$.

2. The glass substrate according to claim 1, wherein the glass substrate has a Value A of 25.0 or more calculated by the following equation:

Value $A = \text{Log } \eta_{500} - [\beta\text{-OH value (mm}^{-1})] \times [\text{content of } B_2O_3 \text{ (mass \%)}]$, wherein the $\beta$-OH value $= (1/X)\log(T_1/T_2)$, where X: thickness (mm),
$T_1$: transmittance (%) at a reference wavelength of 3,846 cm$^{-1}$, and
$T_2$: minimum transmittance (%) at a wavelength around a hydroxyl group absorption wavelength of 3,600 cm$^{-1}$.

3. The glass substrate according to claim 1, wherein the glass substrate has a $\beta$-OH value of 0.20/mm or less.

4. The glass substrate according to claim 1, wherein the glass substrate has a $\beta$-OH value of 0.15/mm or less.

5. The glass substrate according to claim 1, wherein the glass substrate has a content of $B_2O_3$ of less than 2.0 mass %.

6. The glass substrate according to claim 1, wherein the glass substrate comprises as the glass composition, in terms of mass %, 55% to 65% of $SiO_2$, 18.1% to 22% of $Al_2O_3$, 0% to 1% of $B_2O_3$, 0% to less than 0.1% of $Li_2O+Na_2O+K_2O$, 1% to 6% of MgO, 2% to 8% of CaO, 0% to 2% of SrO, 4% to 13% of BaO, 0% to less than 0.010% of $As_2O_3$, and 0% to less than 0.010% of $Sb_2O_3$.

7. The glass substrate according to claim 1, wherein the glass substrate has a content of $Fe_2O_3$ in the glass composition of 0.010 mass % or less.

8. The glass substrate according to claim 1, wherein the glass substrate has a liquidus temperature of 1,300° C. or less.

9. The glass substrate according to claim 1, wherein the glass substrate comprises a formed joined surface in a center portion in a thickness direction.

10. An organic light-emitting diode (OLED) device comprising the glass substrate according to claim 1, wherein the glass substrate is a substrate of the OLED device.

11. The glass substrate according to claim 2, wherein the glass substrate has the $\beta$-OH value of 0.20/mm or less.

12. The glass substrate according to claim 1, wherein the glass substrate comprises as the glass composition, in terms of mass %, 1.1% to 6.6% of $B_2O_3$.

13. The glass substrate according to claim 2, wherein the glass substrate comprises as the glass composition, in terms of mass %, 1.1% to 6.6% of $B_2O_3$.

* * * * *